(12) United States Patent
Wang et al.

(10) Patent No.: US 11,259,403 B1
(45) Date of Patent: Feb. 22, 2022

(54) PRINTED CIRCUIT BOARD STRUCTURE FOR SOLID STATE DRIVES

(71) Applicant: SK hynix Inc., Gyeonggi-do (KR)

(72) Inventors: Wenwei Wang, San Jose, CA (US);
Xiaofang Chen, Milpitas, CA (US);
Danyang Qiao, Santa Clara, CA (US);
Sonny Mirador, Milpitas, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/085,749

(22) Filed: Oct. 30, 2020

(51) Int. Cl.
*H05K 1/02* (2006.01)

(52) U.S. Cl.
CPC ......... *H05K 1/0236* (2013.01); *H05K 1/0231* (2013.01); *H05K 2201/093* (2013.01)

(58) Field of Classification Search
CPC ..... H05K 1/0216–0227; H05K 1/0236; H05K 1/0231; H05K 2201/093
See application file for complete search history.

(56) References Cited

U.S. PATENT DOCUMENTS

| | | | |
|---|---|---|---|
| 7,016,198 B2 | 3/2006 | Fessler et al. | |
| 7,728,428 B2 | 6/2010 | Lim | |
| 10,143,077 B1* | 11/2018 | Kuo | H05K 1/0224 |
| 2002/0176236 A1* | 11/2002 | Iguchi | H05K 1/0216 361/753 |
| 2011/0221028 A1* | 9/2011 | Shimizu | H05K 1/0218 257/487 |
| 2012/0317332 A1* | 12/2012 | Kwak | G06F 12/0246 711/102 |
| 2020/0294941 A1* | 9/2020 | Naito | H01L 23/66 |
| 2021/0193567 A1* | 6/2021 | Cheah | H01L 23/5386 |

* cited by examiner

*Primary Examiner* — Hoa C Nguyen
(74) *Attorney, Agent, or Firm* — IP & T Group LLP

(57) ABSTRACT

A printed circuit board (PCB) structure is provided for a solid state drive. In an embodiment, a solid state drive includes top and bottom layers, multiple intermediate layers and a ground cage. Each of top and bottom layers includes a plurality of components for operation of the solid state drive. The multiple intermediate layers enable electrical signals to pass between components on the top and bottom layers, one of the multiple intermediate layers including a power plane having a high voltage relative to each of the other planes. The ground cage shields signal traces on the same layer as the power plane and planes in adjacent layers from noise generated by the power plane.

9 Claims, 13 Drawing Sheets

(PRIOR ART)

(PRIOR ART)

Noisy Power Planes (Aggressor)

Neighboring Planes or Traces (Victim)

Ground Planes

PRINTED CIRCUIT BOARD STRUCTURE FOR SOLID STATE DRIVES

BACKGROUND

1. Field

Embodiments of the present disclosure relate to a printed circuit board structure.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

An electronic device such as a data storage device may be implemented with a printed circuit board (PCB).

SUMMARY

Aspects of the present invention include a printed circuit board (PCB) structure for a data storage device such as a solid state drive.

In one aspect, a solid state drive includes: top and bottom layers, each of which includes a plurality of components for operation of the solid state drive; multiple intermediate layers configured to enable electrical signals to pass between components on the top and bottom layers, one of the multiple intermediate layers including a power plane having a high voltage relative to each of the other planes; and a ground cage configured to shield the noisy high voltage power planes, which greatly minimizes the noise coupled to the victim power planes or signal traces around the neighboring or adjacent layers.

In another aspect, a printed circuit board for a solid state drive, includes: top and bottom layers, each of which includes a plurality of components for operation of the solid state drive; and multiple intermediate layers disposed between the top and bottom layers and configured to enable electrical signals to pass between components on the top and bottom layers. The multiple intermediate layers include: a first intermediate layer including a high power plane (100) having a high voltage and first and second signal traces (200A, 200B) adjacent to the high power plane; a second intermediate layer (400) formed above the first intermediate layer and below the top layer and including a first low power plane (410 or 430) having a low voltage less than the high voltage; a third intermediate layer (500) formed below the first intermediate layer and above the bottom layer and including a second low power plane (510 or 530) having the low voltage; and a ground cage (300A, 300B, 300C) configured to enclose the high power plane such that capacitive and inductive paths between the high power plane and each of the first and second signal traces and capacitive and inductive paths between the high power plane and each of the first and second low power planes are blocked.

Additional aspects of the present invention will become apparent from the following description.

DETAILED DESCRIPTION

Figure 1:
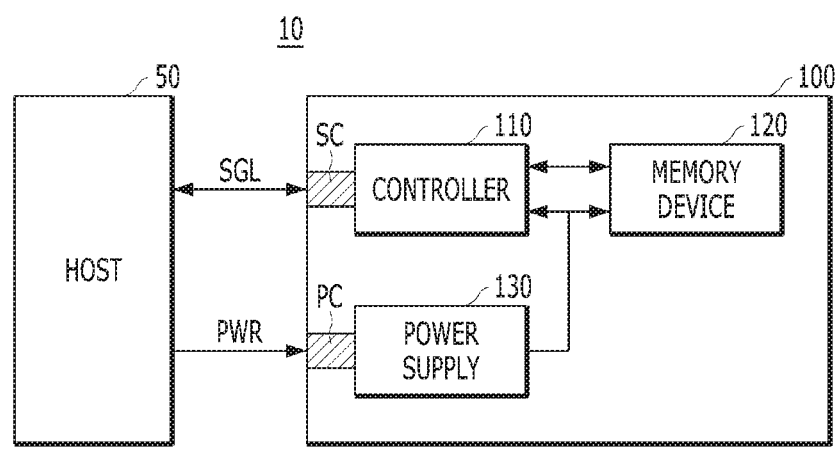
FIG. 1 is a block diagram illustrating an example of a data processing system.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating an example of a data processing system 10.

Referring to FIG. 1, the data processing system 10 may include a host device 50 and a storage device (which may be implemented as a memory system) 100. The storage device 100 may receive a request from the host device 50 and operate in response to the received request. For example, the storage device 100 may store data to be accessed by the host device 50.

The host device 50 may be implemented with any of various kinds of electronic devices. In various embodiments, the host device 50 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 50 may include a portable electronic device such as a mobile phone, a smart phone, an e-book, an MP3 player, a portable multimedia player (PMP), and/or a portable game player.

The storage device 100 may include a controller 110, a memory device 120 and a power supply 130. The controller 110 may exchange a signal SGL (which may represent multiple signals) with the host device 50 through a signal connector SC. The signal SGL may include a command, an address, and data. The signal connector SC may be configured as any of various types of connectors according to an interface scheme between the host device 50 and the storage device 100.

The controller 110 may control overall operation of the memory device 120 in response to a signal SGL from the host device 50. For example, the controller 110 may control the memory device 120 to perform one or more erase, program, and read operations.

The memory device 120 may be coupled to the controller 110 through one or more channels. The memory device 120 may be implemented with a plurality of nonvolatile memory devices. The controller 110 and the memory device 120 may be implemented with any of various kinds of storage devices such as a solid state drive (SSD) and a memory card.

The power supply 130 may provide components in the storage device 100 with power PWR inputted through a power connector PC from the host device 50.

Figure 2:
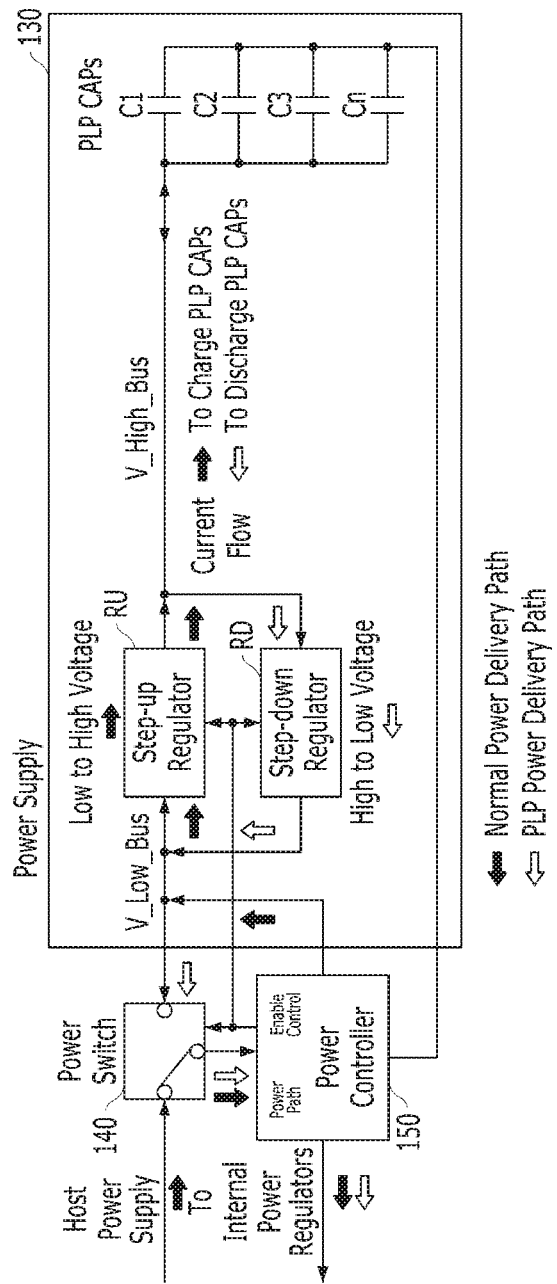
FIG. 2 is a diagram illustrating an example of a power supply for a storage device.

FIG. 2 is a diagram illustrating an example of the power supply 130 for the storage device 100.

Referring to FIG. 2, the power supply 130 may include a plurality of capacitors C1 to Cn, a voltage step-up regulator RU and a voltage step-down regulator RD. Although not shown in FIG. 1, the storage device 100 may further include a power switch 140 and a power controller 150 coupled to the power supply 130, as shown in FIG. 2.

The power switch 140 may provide a normal power delivery path or a power loss protection (PLP) delivery path under control of the power controller 150. In the normal power delivery path, power provided from the host device 50 is delivered through the power switch 140, the power controller 150, and the voltage step-up regulator RU to the plurality of capacitors C1 to Cn. The voltage step-up regulator RU may convert a low input voltage from the host device 50 to a high voltage (e.g., 35V or more). The high voltage may be used to charge the plurality of capacitors C1 to Cn. The power supply 130 may include a first path (i.e., V_High_Bus) to pass power (i.e., a high voltage) between the voltage regulator RU, RD and the plurality of capacitors C1 to Cn, and a second path (i.e., V_Low_Bus) to pass power (i.e., a low voltage) between the voltage regulator RU, RD and the host device 50 through the power switch 140. Further, the power supply 130 may include a third path to pass a signal to the voltage regulator RU, RD from the power controller 150.

When power to the storage device 100 from the host device 50 is interrupted or cut-off, the plurality of capacitors C1 to Cn may be discharged and the energy stored therein may be delivered through the PLP delivery path including the voltage step-down regulator RD, the power switch 140, the power controller 150 and internal power regulators. The storage device 100 may use the plurality of capacitors as a power source to back up data from an internal memory of the controller 110 (e.g., volatile memory) to the memory device 120 (e.g., NAND flash device).

As such, the plurality of capacitors C1 to Cn may form a capacitor array to provide sufficient energy to maintain power rail voltages for data back-up transfer from the controller 110 to the memory device 120. The capacitor array or a large bulk capacitor may serve as a power loss protection (PLP) capacitor for the storage device 100. The step-up regulator RU may be implemented with a voltage regulator including switching components (e.g., FETs), which is normally used for high power conversion efficiency. The step-up regulator RU may be connected to the PLP capacitor through the power path V_High_Bus. The power paths V_High_Bus and V_Low_Bus may be implemented in a printed circuit board (PCB) of the storage device 100 (e.g., a solid state drive (SSD)) by using one or more power planes or layer.

Figure 3A:
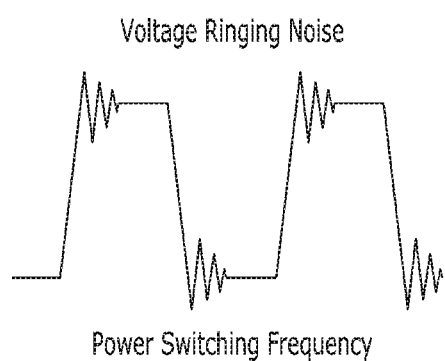
FIGS. 3A and 3B are diagrams illustrating voltage ringing noise and a current inrush spike which occur in an electrical path, respectively.
Figure 3B:
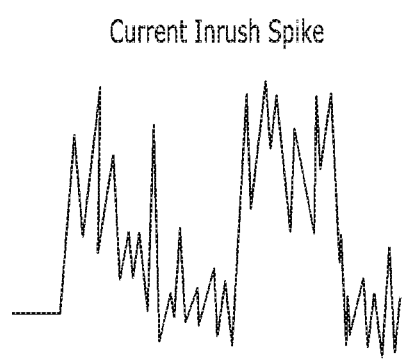

Parasitic capacitance and parasitic inductance may exist along electrical paths and within electrical components. As the switching components of the voltage regulator are turned on and off at high frequency (e.g., 1 MHz or more) and thus suddenly change current paths, intense voltage ringing noise at a few hundred MHz may occur, and a significantly high current inrush spike may also occur during the charge process and discharge process of the PLP capacitor, as shown in FIGS. 3A and 3B.

Figure 4:
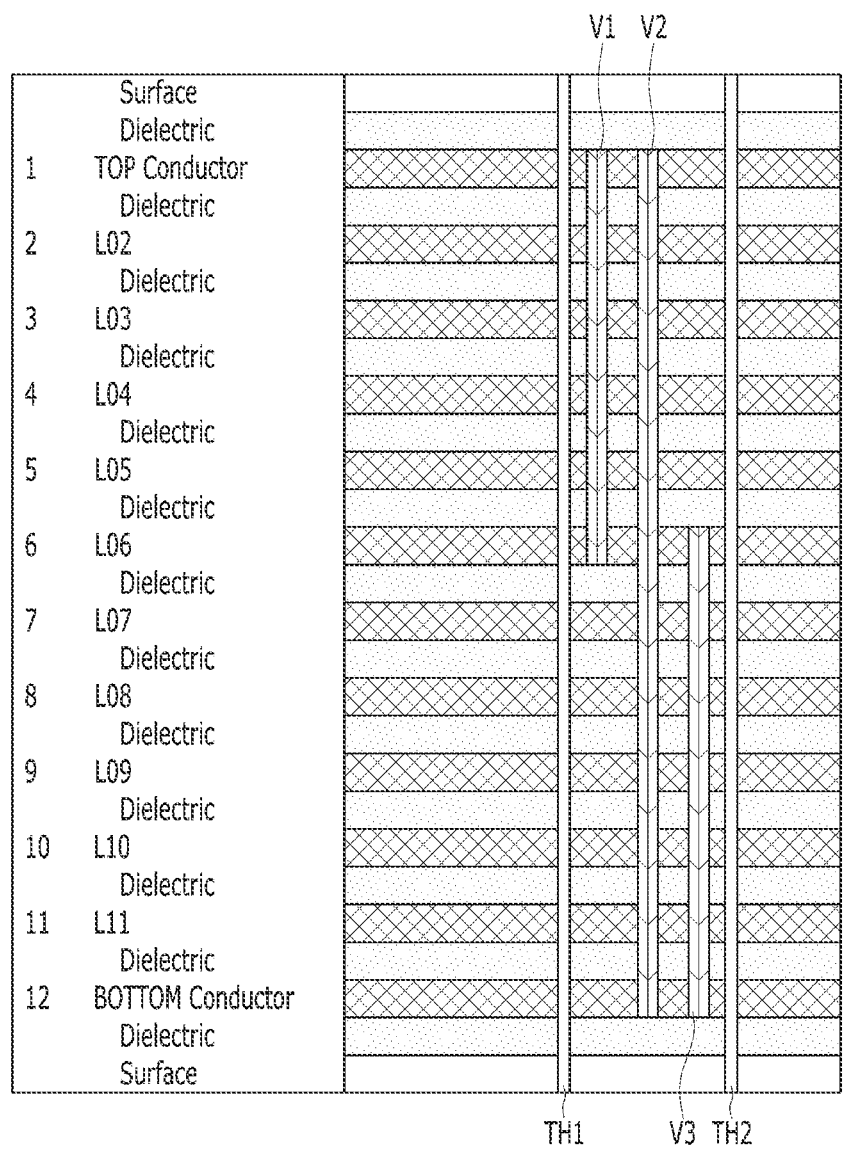
FIG. 4 is a diagram illustrating an example of a multi-layer printed circuit board.

FIG. 4 is a view illustrating an example of a multi-layer printed circuit board (PCB).

Referring to FIG. 4, the PCB may have a structure of multiple layers. In the illustrated example, the PCB has 12 layers including a top conductor layer, a bottom conductor layer, and ten conductive layers L02 to L11 disposed between the top and bottom conductive layers. A surface dielectric layer may be disposed between an upper surface of the PCB and the top conductor layer, and another surface dielectric layer may be disposed between a lower surface of the PCB and the bottom conductor layer. Components of a particular circuit (e.g., a power supply 130 of FIG. 2) may be installed on the top conductor layer and the bottom conductor layer. Each of the second conductor layer L02 to the eleventh conductor layer L11 may pass power or a signal or may form a ground. In an example, the second conductor layer L02 to the eleventh conductor layer L11 are used as shown in the following Table1:

| Layer | Use |
|---|---|
| L02 | Ground Plane |
| L03 | Signal Trace |
| L04 | Signal Trace |
| L05 | Ground Plane |
| L06 | Power Plane |
| L07 | Power Plane |
| L08 | Ground Plane |
| L09 | Signal Trace |
| L10 | Signal Trace |
| L11 | Ground Plane |

In Table1, each trace may be a thin copper conductor for passing signals and each plane may be a fat copper conductor for passing power.

Further, the PCB may include through holes TH1, TH2 between the upper surface and the lower surface, and vertical vias V1, V2, V3 used to make electrical connections between layers.

On the PCB as described above, structural mutual capacitance and structural mutual inductance may exist between neighboring layers and between neighboring power planes or signal traces on the same layer. In other words, a certain power plane (i.e., aggressor) may cause power noise to be coupled to other power planes or signal traces (i.e., victims). The power noise coupling situation has been found to be even worse in a circuit area where a voltage could be several times higher than the rest circuit areas on the PCB. For example, when the power supply 130 of FIG. 2 is implemented with a PCB with multiple layers as shown in FIG. 4, inventors observed that a power plane for the path V_High_Bus causes voltage ringing noise and current inrush spike to occur in other planes or traces. Such a power noise coupling contamination is not tolerable because it will ultimately cause signal integrity issues and lead to system malfunction of a storage device.

Figure 5:
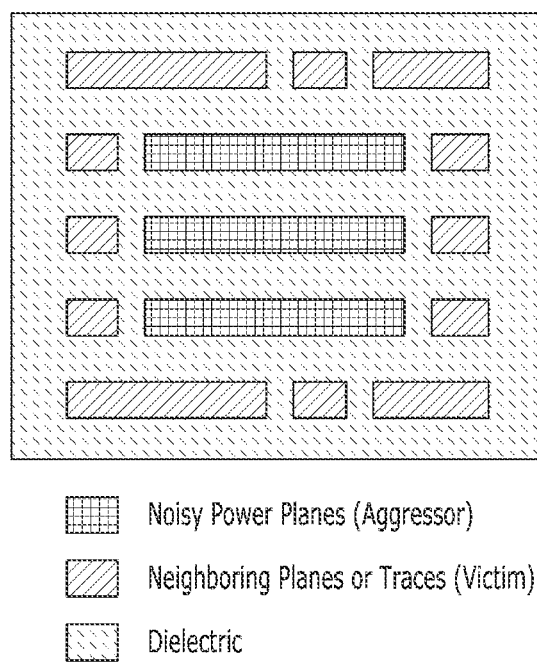
FIG. 5 is a sectional view illustrating an example of a printed circuit board (PCB) section with noisy power planes and neighboring planes or traces.

FIG. 5 is a sectional view illustrating an example of a printed circuit board (PCB) section with noisy power planes and neighboring planes or traces.

Referring to FIG. 5, the PCB may include the noisy power planes, which may be individually and collectively referred to as the aggressor, and the neighboring planes or traces, which are victims. In the illustrated example, the PCB may include 3 noisy power planes which are electrically connected together on the PCB. Each noisy power plane may be a one or more layers depending on the specific design of the PCB. A victim plane may be on the same layer as a noisy power plane or on a neighboring layer. Gaps between aggressor planes and victim planes may be filled with dielectric material.

Noise coupling from the aggressor to the victims is analyzed as below with reference to FIGS. 6A and 7B.

Figure 6A:
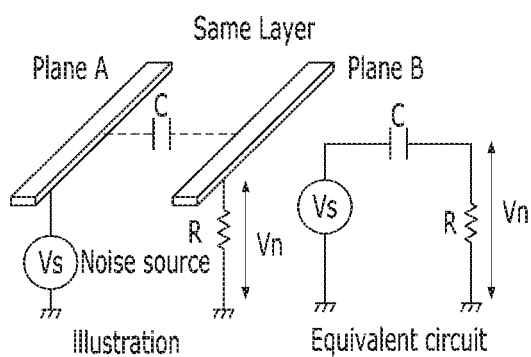
FIGS. 6A and 6B illustrate the capacitive coupling path through the electrostatic field, and its equivalent circuit.
Figure 6B:
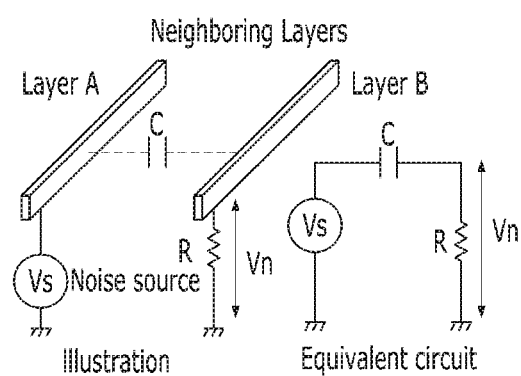

FIGS. 6A and 6B illustrate the capacitive coupling path through the electrostatic field, and its equivalent circuit. The coupling path may be on the same layer (FIG. 6A), and between neighboring layers (FIG. 6B). The coupled voltage on the victim plane or trace can be expressed as:

$$Vn = j\omega CRVs \quad (1)$$

In Equation (1), $\omega = 2\pi f$, f is the ringing noise frequency, C is the coupling path mutual capacitance, R is load impedance, and Vs is the voltage ringing noise of a power plane (e.g., the power plane V_High_Bus of the PLP capacitor in FIG. 2).

It can be seen from Equation (1) that, when C is large enough, the higher frequency and high voltage ringing noise can be coupled to the victim plane or trace as Vn.

Figure 7A:
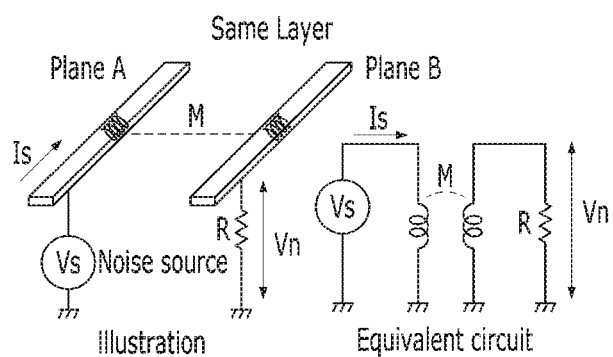
FIGS. 7A and 7B illustrate the inductive coupling path through the electrostatic field, and its equivalent circuit.
Figure 7B:
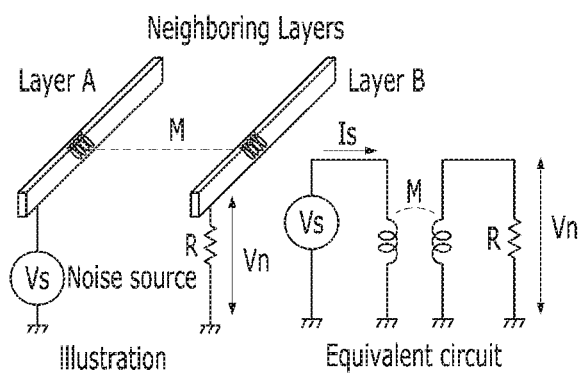

FIGS. 7A and 7B illustrate the inductive coupling path through the electrostatic field, and its equivalent circuit. The coupling path may be on the same layer (FIG. 7A), and between neighboring layers (FIG. 7B). The coupled voltage on the victim plane or trace can be expressed as:

$$Vn = j\omega MIs \quad (2)$$

In Equation (2), $\omega = 2\pi f$, f is the inrush spike frequency, M is the coupling path mutual inductance, and Is is the current inrush spike of a power plane (e.g., the power plane V_High_Bus of the PLP capacitor in FIG. 2).

It can be seen from Equation (2) that, when M is large enough, the higher frequency and high current spiking can be coupled to the victim plane or trace as Vn.

As described above, in a printed circuit board, voltage ringing noise and a current inrush spike may occur in an electrical path for a storage device (e.g., a power supply 130 in FIG. 2). Accordingly, it is desirable to provide a structure capable of avoiding high energy ringing noise and a current inrush spike in a printed circuit board (PCB). Embodiments provide a PCB structure used to encapsulate one or more high voltage power planes as the aggressor, where the high voltage power planes are enclosed by several ground planes. As a result, the power noise coupling paths to the victim planes or traces are effectively blocked or terminated.

Figure 8A:
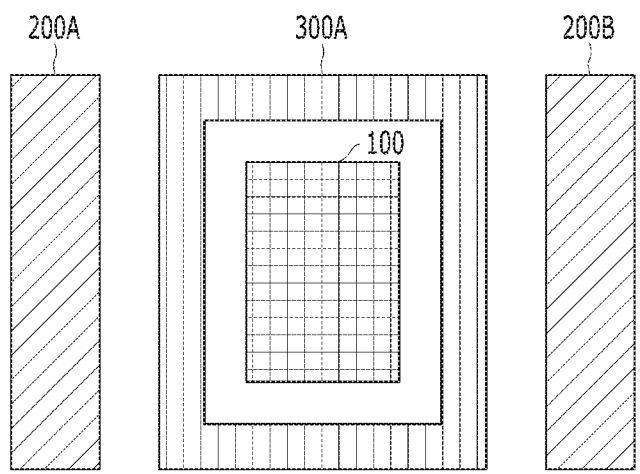
FIGS. 8A and 8B are views illustrating a structure of a printed circuit board (PCB) in accordance with embodiments of the present invention.
Figure 8A:
Figure 8A:
Figure 8A:
Figure 8B:
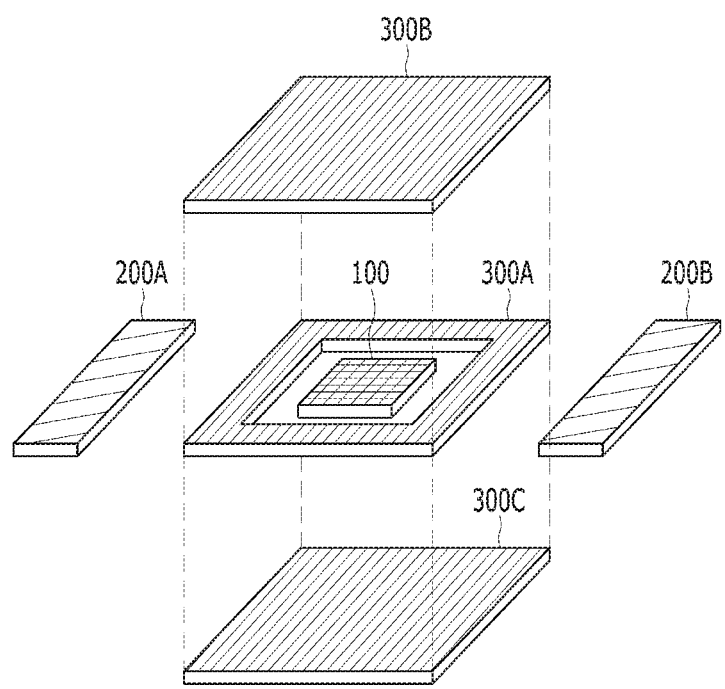

FIGS. 8A and 8B are views illustrating a structure of a printed circuit board (PCB) in accordance with embodiments of the present invention.

Referring to FIGS. 8A and 8B, the PCB may include a high voltage power plane 100 as the aggressor and two neighboring planes or traces 200A, 200B, collectively referred to as the victim element. In some embodiments, the high voltage power plane 100 may be a power path V_High_Bus between the regulators RU, RD and the PLP capacitors, as shown in the power supply 130 in FIG. 2. Two neighboring planes or traces 200A, 200B may be a power path V_Low_Bus between the regulators RU, RD and the power switch 140 or a signal path between the regulators RU, RD and the power controller 150.

The high voltage power plane 100 may be enclosed (or encapsulated) by an enclosure component. In some embodiments, the enclosure component may be implemented with a ground cage including multiple ground planes. In the illustrated example, the enclosure component may include a first ground plane 300A, a second ground plane 300B and a third ground plane 300C. The first ground plane 300A may be arranged at the same layer as the high voltage power plane 100 (i.e., a noisy power plane). The second ground plane 300B may be arranged above the first ground plane 300A. The third ground plane 300C may be arranged below the first ground plane 300A. The first ground plane 300A may horizontally enclose the periphery of the high voltage power plane 100, and the second ground plane 300B and the third ground plane 300C may cooperate to vertically enclose the high voltage power plane 100. In other words, the first ground plane 300A to the third ground plane 300C may form the ground cage to enclose the high voltage power plane 100. The high voltage power plane 100 may include one or more power planes. As such, embodiments provide a special PCB structure to effectively shield the high voltage plane or planes so that the high energy ringing noise and a current inrush spike may be constrained within the structure without adding extra components or costs. The special PCB structure may be referred to as "a sandwiched PCB structure." Thus, mutual capacitance and mutual inductance between the noisy power plane as the aggressor and power planes or traces as the victim element may be minimized.

Figure 9:
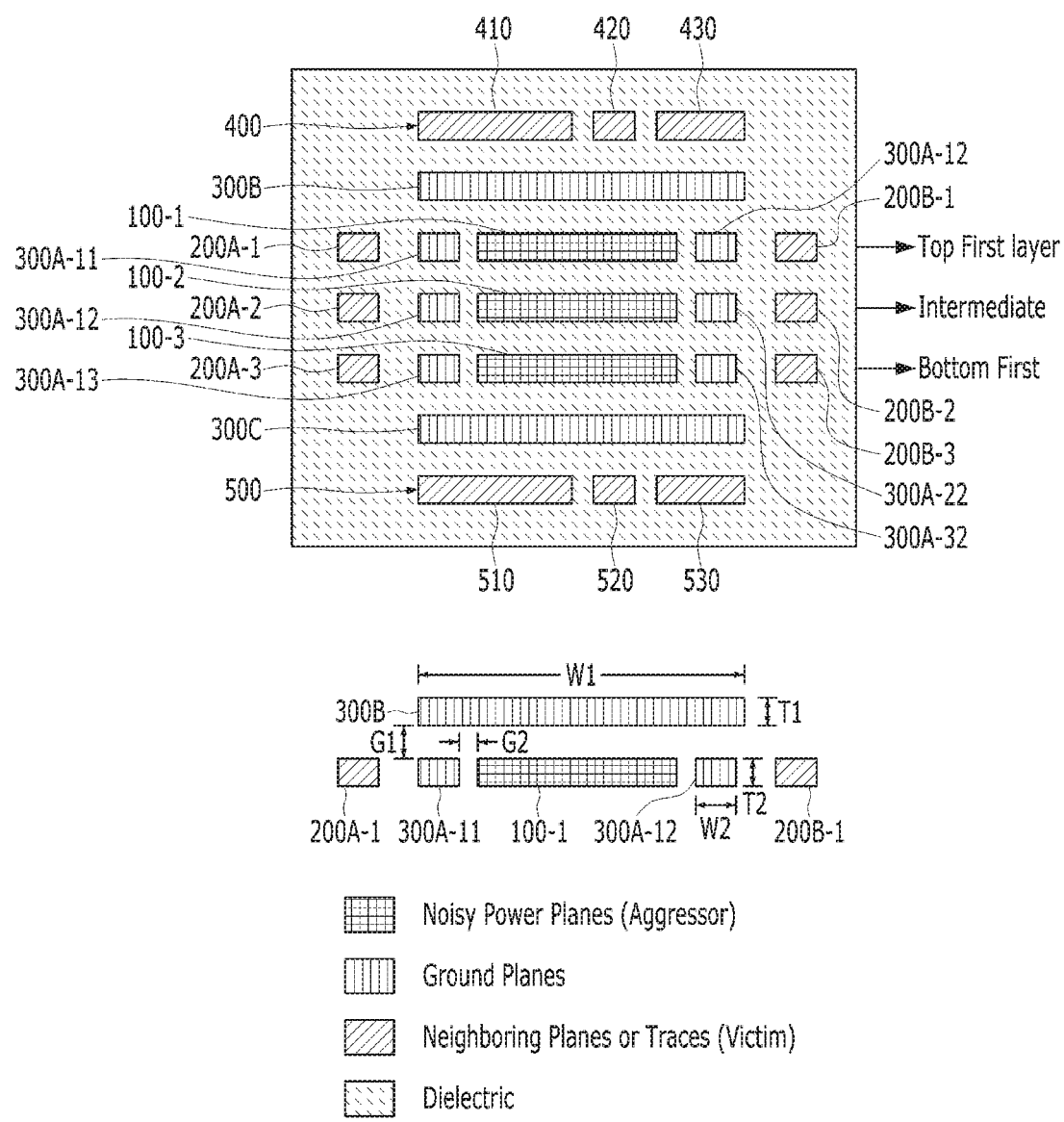
FIG. 9 is a sectional view illustrating a printed circuit board (PCB) structure for a storage device in accordance with embodiments of the present invention.

FIG. 9 is a sectional view illustrating a printed circuit board (PCB) structure for a storage device (e.g., SSD) in accordance with embodiments of the present invention.

Referring to FIG. 9, the PCB structure may include first layers, a second layer 400 and a third layer 500. Each of the first layers may include a first plane configured to pass power as a high voltage power plane (i.e., aggressor), and second and third planes (i.e., victim) adjacent to the first plane. By way of example and without any limitation, the first layers may include 3 first layers including top, intermediate and bottom first layers. The top first layer may include a first plane 100-1, a second plane 200A-1 and a third plane 200B-1. The intermediate first layer may include a first plane 100-2, a second plane 200A-2 and a third plane 200B-2. The bottom first layer may include a first plane 100-3, a second plane 200A-3 and a third plane 200B-3. In some embodiments, each of the second and third planes may include a power plane to pass power or a signal trace to pass a signal.

The second layer 400 may be formed over the top first layer. For example, the second layer 400 may include multiple planes 410, 420, 430. The third layer 500 may be formed below the bottom first layer. For example, the third layer 500 may include multiple planes 510, 520, 530. In some embodiments, each of the second and third layers 400, 500 may include a power plane to pass power or a trace to pass a signal.

The PCB structure may include an enclosure component including a ground cage configured to horizontally and vertically enclose the first planes 100-1, 100-2, 100-3, which form the aggressor. In some embodiments, the ground cage may include multiple ground planes which are arranged horizontally and vertically such that capacitive and inductive paths between the aggressor and the victim are blocked.

The ground cage may include a fourth plane 300A-11 between the first plane 100-1 and the second plane 200A-1 and a fifth plane 300A-12 between the first plane 100-1 and the third plane 200B-1. The ground cage may include a fourth plane 300A-21 between the first plane 100-2 and the second plane 200A-2 and a fifth plane 300A-22 between the first plane 100-2 and the third plane 200B-2. The ground cage may include a fourth plane 300A-31 between the first plane 100-3 and the second plane 200A-3 and a fifth plane 300A-32 between the first plane 100-3 and the third plane 200B-3. Further, the ground cage may include a fourth layer 300B formed between the top first layer and the second layer 400, and a fifth layer 300C formed between the bottom first layer and the third layer 500. Multiple ground planes of the ground cage may be electrically coupled.

In some embodiments, thicknesses and widths of layers and planes may be adjusted such that mutual coupling capacitance and mutual coupling inductance are minimized.

For each first layer, the first to fifth planes may have the same thickness T2. For the top first layer, a fourth plane 300A-11 between the first plane 100-1 and the second plane 200A-1 and a fifth plane 300A-12 between the first plane 100-1 and the third plane 200B-1 may have the thickness T2. The fourth plane 300A-11 and the fifth plane 300A-12 may have the same width W2. For the intermediate first layer, a fourth plane 300A-21 between the first plane 100-2 and the second plane 200A-2 and a fifth plane 300A-22 between the first plane 100-2 and the third plane 200B-2 may have the thickness T2. The fourth plane 300A-21 and the fifth plane 300A-22 may have the same width W2. For the bottom first layer, a fourth plane 300A-31 between the first plane 100-3 and the second plane 200A-3 and a fifth plane 300A-32 between the first plane 100-3 and the third plane 200B-3 may have the thickness T2. The fourth plane 300A-31 and the fifth plane 300A-32 may have the same width W2.

The fourth layer 300B and the fifth layer 300C may have the same thickness T1 and may have the same width W1.

The PCB structure may include gaps between layers and gaps between planes in each layer. In some embodiments, these gaps may be filled with a dielectric material (e.g., epoxy laminate material).

The top first layer may include a first gap, which may have length G2, between the first plane 100-1 and the fourth plane 300A-11, a second gap, which also may have a length G2, between the first plane 100-1 and the fifth plane 300A-12, a third gap between the second plane 200A-1 and the fourth plane 300A-11 and a fourth gap between the third plane 200B-1 and the fifth plane 300A-12. The intermediate first layer may include a first gap between the first plane 100-2 and the fourth plane 300A-21, a second gap between the first plane 100-2 and the fifth plane 300A-22, a third gap between the second plane 200A-2 and the fourth plane 300A-21 and a fourth gap between the third plane 200B-2 and the fifth plane 300A-22. The bottom first layer may include a first gap between the first plane 100-3 and the fourth plane 300A-31, a second gap between the first plane 100-3 and the fifth plane 300A-32, a third gap between the second plane 200A-3 and the fourth plane 300A-31 and a fourth gap between the third plane 200B-3 and the fifth plane 300A-32.

The PCB structure may include a fifth gap, which may have a length G1, between the top first layer and the fourth layer 300B, a sixth gap between the second layer 400 and the fourth layer 300B, a seventh gap between the bottom first layer and the fifth layer 300C, and an eighth gap between the third layer 500 and the fifth layer 300C.

In some embodiments, gaps between layers and gaps between planes may be adjusted such that mutual coupling capacitance and mutual coupling inductance are minimized. In some embodiments, the PCB structure may have multiple layers as shown in FIG. 4 and the multiple layers have a thickness of less than 1 mm, where G1 is less than 50 um and G2 is less than 100 um such that the high voltage ringing noise and high current inrush spike at high frequency could cross over the gaps vertically and horizontally, reaching the victim planes or traces.

Figure 10A:
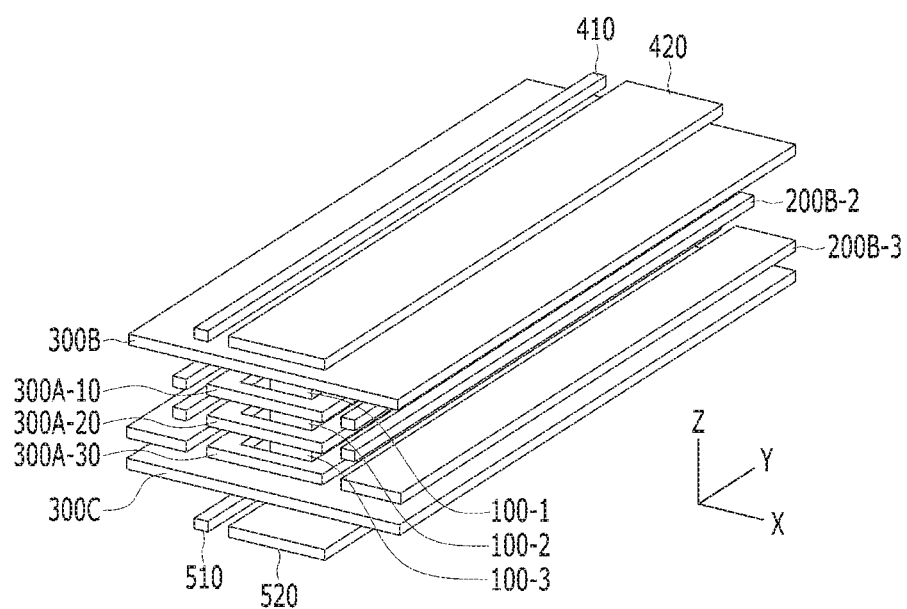
FIG. 10A is a three-dimensional (3D) perspective view of a printed circuit board (PCB) structure for a storage device, such as the PCB structure shown in FIG. 9, in accordance with embodiments of the present invention.
Figure 10B:
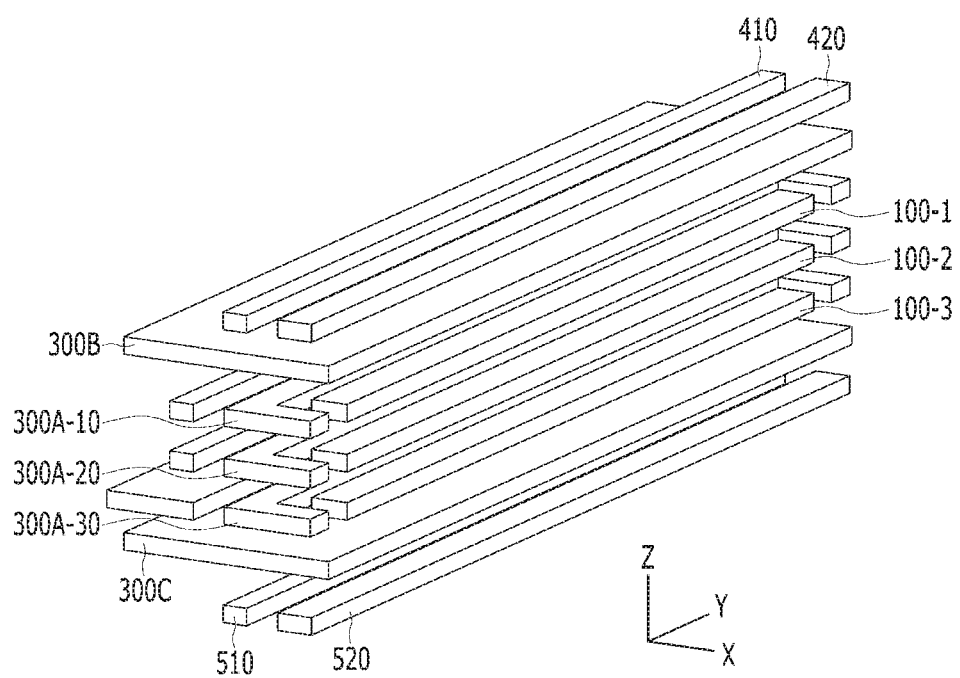
FIG. 10B is a sectional view along Y-axis of a printed circuit board (PCB) structure shown in FIG. 10A.
Figure 10C:
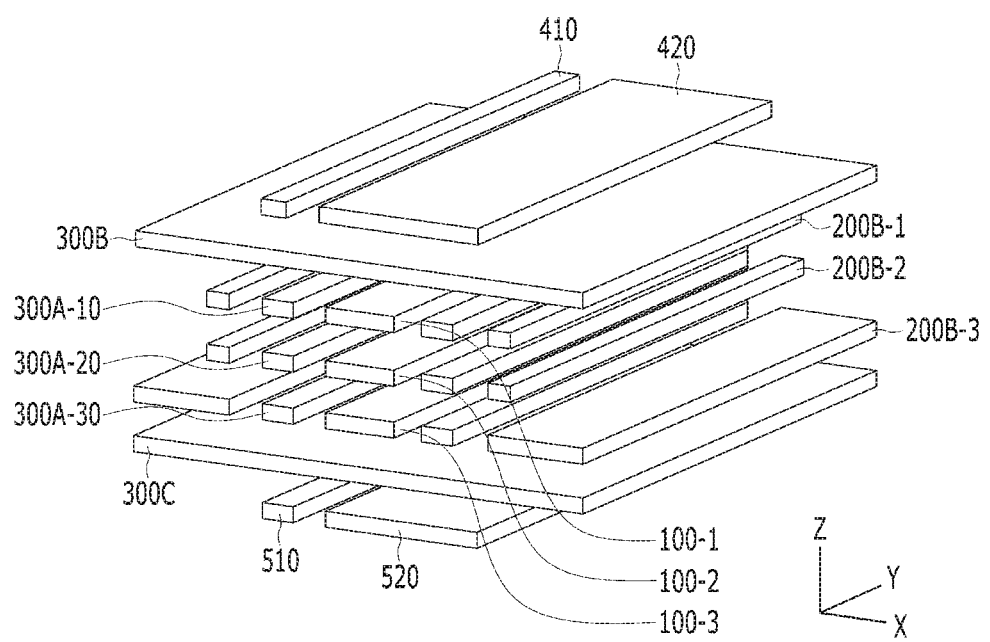
FIG. 10C is a sectional view along X-axis of a printed circuit board (PCB) structure shown in FIG. 10A.

FIG. 10A is a three-dimensional (3D) perspective view of a printed circuit board (PCB) structure for a storage device, i.e., the PCB structure shown in FIG. 9, in accordance with embodiments of the present invention. The PCB structure is shown relative to an XYZ coordinate system. FIG. 10B is a sectional view of a printed circuit board (PCB) structure shown in FIG. 10A along the Y axis. FIG. 10C is a sectional view of a printed circuit board (PCB) structure shown in FIG. 10A along the X axis.

Referring to FIGS. 10A to 10C, high voltage power planes 100-1, 100-2, 100-3 are enclosed by an enclosure component including multiple ground planes 300A-10, 300A-20, 300A-30, 300B, 300C. The enclosure component is disposed and configured to block or significantly reduce the coupling of noise (i.e., voltage ringing noise and current inrush spike) from the high voltage power planes 100-1, 100-2, 100-3 to victim power planes or signal traces 200B-1, 200B-2, 200B-3, 410, 420, 510, 520.

As described above, embodiments provide a structure capable of avoiding power noise coupling (e.g., high energy ringing noise and current inrush spike) in a printed circuit board (PCB) for an electronic device such as a storage device (e.g., SSD). In accordance with embodiments, the PCB structure encapsulates one or more high voltage power planes by using several ground planes. Accordingly, embodiments block power noise coupling from the high voltage power planes to victim power planes or signal traces.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A printed circuit board for a solid state drive, comprising:
    top and bottom layers, each of which includes a plurality of components for operation of the solid state drive; and
    multiple intermediate layers disposed between the top and bottom layers and configured to enable electrical signals to pass between components on the top and bottom layers,
    wherein the multiple intermediate layers include:
    a first intermediate layer including a high power plane having a high voltage and first and second signal traces adjacent to the high power plane;
    a second intermediate layer formed above the first intermediate layer and below the top layer and including a first low power plane having a low voltage less than the high voltage;
    a third intermediate layer formed below the first intermediate layer and above the bottom layer and including a second low power plane having the low voltage; and
    a ground cage configured to enclose the high power plane such that capacitive and inductive paths between the high power plane and each of the first and second signal traces and capacitive and inductive paths between the high power plane and each of the first and second low power planes are blocked.

2. The printed circuit board of claim 1, wherein the ground cage includes:
    a first ground plane disposed between the high power plane of the first immediate layer and the first lower power plane of the second immediate layer;
    a second ground plane disposed between the high power plane of the first immediate layer and the second lower power plane of the third immediate layer;
    a third ground plane disposed between the high power plane and the first signal trace of the first immediate layer; and
    a fourth ground plane disposed between the high power plane and the second signal trace of the first immediate layer.

3. The printed circuit board of claim 2, wherein the first to fourth ground planes are electrically coupled.

4. The printed circuit board of claim 3, wherein each of the first and second ground planes is disposed such that there is a first gap between the first immediate layer and each of the second and third immediate layers.

5. The printed circuit board of claim 4, wherein each of the third and fourth ground planes is disposed such that there is a second gap between the high power plane and each of the first and second signal traces, the second gap different from the first gap.

6. The printed circuit board of claim 5, wherein each gap contains epoxy laminate material.

7. The printed circuit board of claim 5, wherein each of the first and second ground planes has a first thickness.

8. The printed circuit board of claim 7, wherein each of the high power plane, the first and second signal traces and the first and second ground planes has a second thickness different from the first thickness.

9. The printed circuit board of claim 1, wherein each of the second and third intermediate layers further includes a signal trace.

* * * * *